United States Patent
Piper

(10) Patent No.: US 8,841,676 B2
(45) Date of Patent: Sep. 23, 2014

(54) VERTICAL INTEGRATED SEMICONDUCTOR DEVICE WITH MULTIPLE CONTINUOUS SINGLE CRYSTAL SILICON LAYERS VERTICALLY SEPARATED FROM ONE ANOTHER

(71) Applicant: WaferTech, LLC, Camas, WA (US)

(72) Inventor: Daniel Piper, Vancouver, WA (US)

(73) Assignee: Wafertech, LLC, Camas, WA (US)

( * ) Notice: Subject to any disclaimer, the term of this patent is extended or adjusted under 35 U.S.C. 154(b) by 0 days.

(21) Appl. No.: 13/932,776

(22) Filed: Jul. 1, 2013

(65) Prior Publication Data

US 2013/0285195 A1      Oct. 31, 2013

Related U.S. Application Data

(62) Division of application No. 13/212,852, filed on Aug. 18, 2011, now Pat. No. 8,546,250.

(51) Int. Cl.
| | |
|---|---|
| *H01L 29/10* | (2006.01) |
| *H01L 27/085* | (2006.01) |
| *H01L 27/06* | (2006.01) |
| *H01L 27/12* | (2006.01) |

(52) U.S. Cl.
CPC .......... *H01L 27/085* (2013.01); *H01L 27/0688* (2013.01); *H01L 27/12* (2013.01)
USPC ......................................................... 257/67

(58) Field of Classification Search
USPC .............. 257/67, 74, 278, 347, 353, E21.614, 257/E27.026, E25.006, E25.013, E25.021, 257/E25.027, E23.085, E21.193, E21.562, 257/E21.571, E31.045, E31.092, E21.115; 438/149, 150, 153, 155, 164, 412, 489, 438/490, 637, 672, 674, 675, 629, 478
See application file for complete search history.

(56) References Cited

U.S. PATENT DOCUMENTS

| | | |
|---|---|---|
| 6,885,106 B1 | 4/2005 | Damberg et al. |
| 7,012,314 B2 | 3/2006 | Bude et al. |
| 7,230,336 B2 | 6/2007 | Adams et al. |

(Continued)

OTHER PUBLICATIONS

Oh-Hun Nam, Michael D. Bremser, Tsevetanka S. Zheleva and Robert F. Davis, Lateral epitaxy of low defect GaN via organometallic vapor phase epitaxy, Appl. Phys. Lett. vol. 71 No. 18, Nov. 3, 1997, 1997, American Institute of Physics, pp. 2638-2640.

*Primary Examiner* — Selim Ahmed
(74) *Attorney, Agent, or Firm* — Duane Morris LLP

(57) ABSTRACT

A vertically integrated semiconductor device includes multiple continuous single crystal silicon layers vertically separated from one another by a dielectric layer or layers. Semiconductor devices are disposed on an underlying single crystal silicon substrate and the continuous single crystal silicon layers. The individual devices are interconnected to one another using tungsten or doped polysilicon leads that extend through openings formed in the continuous single crystal silicon layers. The method for forming the structure includes forming a dielectric material over the single crystal silicon layer or substrate and forming an opening extending down to the surface of the single crystal silicon material to act as a seed layer. An epitaxial silicon growth process begins at the seed location and laterally overgrows the openings. Growth fronts from the various seed locations meet to form a continuous single crystal silicon layer which is then polished.

19 Claims, 11 Drawing Sheets

(56) References Cited

U.S. PATENT DOCUMENTS

| | | |
|---|---|---|
| 7,453,129 B2 | 11/2008 | King et al. |
| 7,608,195 B2 | 10/2009 | Wilson |
| 2005/0184292 A1 | 8/2005 | Kwak et al. |
| 2006/0246709 A1* | 11/2006 | Kim et al. .................... 438/618 |
| 2007/0023794 A1* | 2/2007 | Kang et al. .................... 257/288 |
| 2007/0181953 A1* | 8/2007 | Lyu et al. .................... 257/382 |
| 2008/0067573 A1 | 3/2008 | Jang et al. |
| 2010/0267230 A1 | 10/2010 | Chandrashekar et al. |

* cited by examiner

VERTICAL INTEGRATED SEMICONDUCTOR DEVICE WITH MULTIPLE CONTINUOUS SINGLE CRYSTAL SILICON LAYERS VERTICALLY SEPARATED FROM ONE ANOTHER

RELATED APPLICATIONS

This application is a divisional of U.S. patent application Ser. No. 13/212,852, filed on Aug. 18, 2011, the contents of which are incorporated herein by reference as if set forth in their entirety.

TECHNICAL FIELD

The disclosure relates to vertically integrated semiconductor devices and methods for forming the same.

BACKGROUND

In today's rapidly advancing electronics and semiconductor manufacturing industries, there is a challenge to produce smaller devices and to increase levels of integration. This applies to the various electronic components themselves, the assembly of electronic components, the packaging and integration of semiconductor chips within the electronic devices and components, and the semiconductor chips themselves.

A semiconductor chip, or simply chip, is formed on a very small, very thin substrate, typically a semiconductor substrate, upon which a plurality of semiconductor devices and components are formed. Multiple layers of patterned interconnect layers and multiple dielectric layers are used. These features enable the isolation and coupling of the various semiconductor devices and components that combine to form an integrated circuit or other complex device, i.e. the chips used in various electronic devices and components There is a particular challenge to utilize the fabrication processes used to manufacture the semiconductor chips themselves to produce more highly integrated chips. Semiconductor chips are extremely costly to produce and to assemble, and there is a drive to use fewer chips in any electronic device and thus to produce chips with increased functionality, i.e. higher integration levels. Higher levels of integration enable the use of fewer semiconductor chips in an electronic device, enabling the device to be formed to more compact dimensions. Alternatively, an electronic device of a given size can be produced to include increased functionality with advanced chip integration levels.

It is therefore advantageous and desirable to increase integration levels of a semiconductor chip.

BRIEF DESCRIPTION OF THE DRAWING

The disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
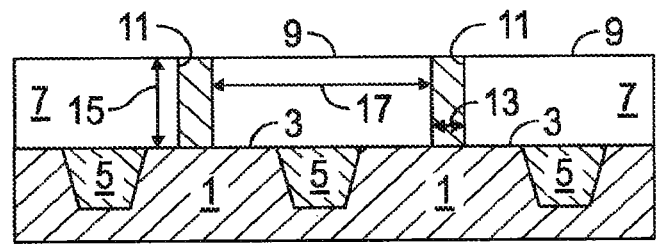
FIGS. 1-3 are cross-sectional views showing a sequence of processing operations according to the disclosure.

The disclosure provides a vertically integrated semiconductor device that includes a single crystal silicon substrate and a plurality of vertically spaced single crystal silicon layers over the substrate. The single crystal silicon layers are continuous layers and are vertically separated from one another and the substrate by a dielectric layer or layers. Semiconductor devices such as MOSFET or other transistor devices, are formed on the respective single crystal silicon layers and the substrate, and are advantageously interconnected to one another by tungsten or highly doped polysilicon leads or other suitable interconnect features.

The vertically integrated semiconductor device may be formed by forming a dielectric layer or layers over the single crystal silicon substrate, then forming openings through the dielectric layer or layers exposing the substrate surface, then performing an epitaxial growth process in which the openings act as seed windows where the epitaxial growth begins. Growth begins with the formation of stems filling these openings and the epitaxial growth laterally overgrows the seed windows. Growth continues above the surface of the dielectric layer or layers until the growth fronts from adjacent stems meet, i.e. intersect. The continuous single crystal silicon layer is formed by the conglomeration of the individual epitaxial growth sections. The single crystal silicon film formed by epitaxial growth may be advantageously planarized to form a continuous single crystal silicon layer with a substantially planar upper surface. The process continues by forming a further dielectric material, i.e. layer or layers, over the planarized continuous single crystal silicon layer and forming openings through the further dielectric material that expose the upper surface of the continuous, planarized single crystalline layer.

Another epitaxial growth process follows whereby the openings in the further dielectric material act as seed windows at which the further epitaxial growth begins. Growth begins with the formation of stems in the seed windows, and continues with the overgrowth above the surface of the further dielectric layer and a planarized continuous single crystalline film is formed, as described supra. The process sequence is repeated multiple times to provide multiple layers of continuous single crystal silicon layers.

Upon the substrate and upon each the continuous single crystal silicon films, semiconductor devices are formed prior to the subsequent formation of the associated superjacent interlevel dielectric layer and the semiconductor devices are interconnected using known techniques and materials such as tungsten. The semiconductor devices include MOSFETs and other transistor devices and isolation structures such as STI's (shallow trench isolation) structures or other isolation devices are formed in the substrate and/or in the epitaxially grown single crystal silicon layers to isolate the semiconductor devices from one another. Semiconductor devices formed on the various continuous single crystal silicon layers and on the substrate are interconnected to one another through dielectric-lined openings formed to extend through the continuous single crystal silicon layers.

Now referring to the drawings, FIG. 1 shows a structure before epitaxial growth takes place. Substrate 1 is a single crystal silicon substrate and includes upper surface 3. Within upper surface 3 are STI (shallow trench isolation) structures 5. Semiconductor devices, not shown, are formed on or in substrate 1 between STI structures 5. MOSFET or other transistor devices may be formed and interconnected to one another, although these aspects of the disclosure are not shown in FIGS. 1-3 so that the epitaxial growth aspects of the disclosure can be more clearly illustrated. Exemplary semiconductor devices will be shown in FIGS. 5A-5R, infra.

First dielectric 7 is formed over upper surface 3 of substrate 1 and various suitable dielectric materials such as silicon oxides, oxynitrides, low-k dielectric materials, high-k dielectric materials and other suitable interlevel dielectrics, may be used as first dielectric 7. First dielectric 7 may include one or multiple separately formed dielectric layers. First dielectric 7 includes top surface 9 and openings 11 are formed extending downward from top surface 9 and through first dielectric 7, exposing portions of upper surface 3. The exposed portions of upper surface 3 within openings 11 act as seed locations during a subsequent epitaxial silicon growth process. The dimensions, i.e. width 13 and height 15 of opening 11 will be chosen to be suitable dimensions in conjunction with the parameters used to form the epitaxial material beginning within openings 11. In one embodiment, height 15 may be about 8000-12000 angstroms, but other dimensions may be used in other exemplary embodiments. Conventional methods may be used to form the structure shown in FIG. 1. Various spacings 17 between adjacent openings 11 may be used and may be chosen in conjunction with epitaxial growth parameters, and the lateral overgrowth desired to form a continuous single crystal silicon layer over top surface 9.

Prior to any epitaxial growth processes, the structure shown in FIG. 1 may be cleaned and prepared for subsequent epitaxial growth. Conventional methods for cleaning are known in the art.

Suitable epitaxial growth conditions are used to cause selective CVD (chemical vapor deposition) epitaxial growth beginning at exposed portions of upper surface 3 within openings 11 which act as the seed locations. In one embodiment, epitaxial growth of single crystal silicon may take place at a temperature of about 650° C., but other temperatures and other conditions may be used in other exemplary embodiments. For additional information on different Si epitaxial growth rates based on various materials and temperatures, please refer to F. C. Eversteyn "Chemical Reaction Engineering in the Semiconductor Industry", Philips Research Reports, 19, 45, 1974, the contents of which are hereby incorporated by reference, as if set forth in their entirety. Growth begins in openings 11 and forms stems 21 shown in FIG. 2. Lateral overgrowth of the single crystal silicon material continues over top surface 9 of first dielectric 7. Growth continues as the growth of epitaxial material 23 extends laterally past stems 21 formed in now-filled openings 11. Epitaxial material 23 is a single crystal silicon material. Growth continues as growth fronts from epitaxial materials 23 grown from adjacent stems 21 intersect at seam 25, which is the intersection where epitaxial materials 23 grown from adjacent stems 21 join to form a continuous film. Epitaxial material 23 includes upper surface 29, which includes convex portions as grown. Maximum thickness 31 will vary in different exemplary embodiments and may be chosen in conjunction with spacing 17 and the desired final thickness of the continuous single crystal silicon layer that will be planarized and is formed from the combination of the respective portions of epitaxial material 23.

Figure 2:
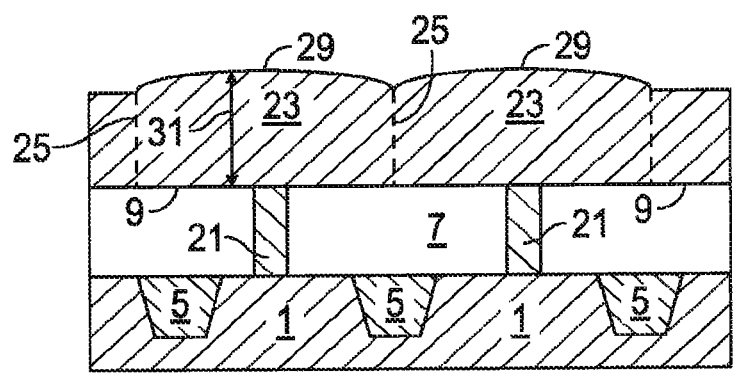
Figure 3:
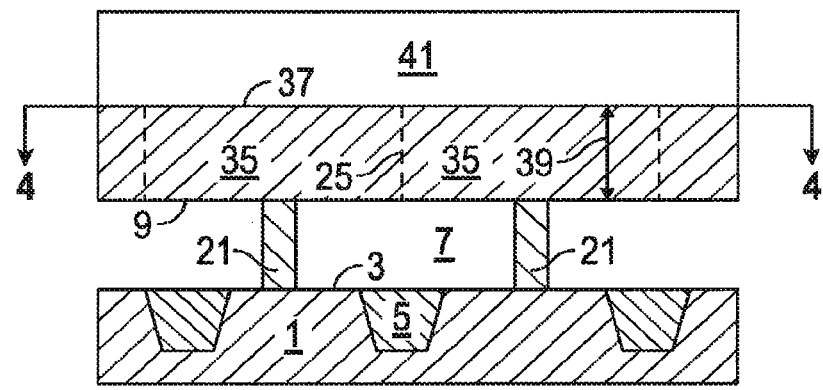

The structure shown in FIG. 2 may then be polished using CMP or other polishing operations to form a continuous single crystal silicon layer with a generally planar upper surface, as shown in FIG. 3.

FIG. 3 shows continuous single crystal silicon layer 35 formed over top surface 9 of first dielectric 7. Continuous single crystal silicon layer 35 may be polished to a thickness 39 that may be about 2-3 microns after polishing, but other thicknesses may be used in other exemplary embodiments. Top surface 37 is substantially planar. Continuous single crystal silicon layer 35 may optionally be doped with various suitable dopant impurities using various suitable methods used to introduce dopant impurities into silicon. Part or all of continuous single crystal silicon layer 35 may be so doped.

Various semiconductor devices including but not limited to MOSFET and other transistor devices and isolation structures such as the STI structures 5 shown in substrate 1, may be formed in top surface 37 of continuous single crystal silicon layer 35. Semiconductor devices will advantageously not be formed at seams 25 to avoid the potential of any crystalline defects in the semiconductor devices.

After semiconductor devices are formed in/on continuous single crystal silicon layer 35 at locations other than seams 25 and after isolation structures are formed in/on top surface 37, second dielectric 41 is formed over top surface 37 and continuous single crystal silicon layer 35. Second dielectric 41 represents one or more separately formed dielectric layers and may include a thickness of 8000-12000 angstroms in one exemplary embodiment but other thicknesses may be used in other exemplary embodiments. Continuous single crystal silicon layer 35 will then be processed in the manner similar to as described for substrate 1, i.e. further openings will be formed in second dielectric 41 and these openings will extend down to top surface 37, advantageously at locations other than at seams 25. The exposed portions of top surface 37 will then act as seed locations and epitaxial growth of silicon crystal silicon takes place to form stems in the further openings, and continues to form a continuous single crystal silicon layer above second dielectric 41.

Figure 4:
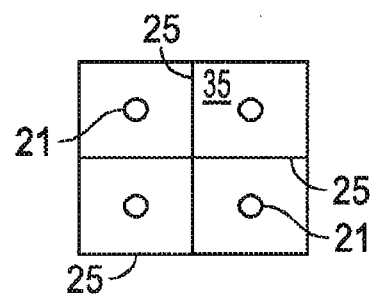
FIG. 4 is a top view taken along line 4-4 of FIG. 3.

FIG. 4 is a top view of a portion of FIG. 3 showing the individual growth portions joined together to form a continuous single crystal silicon layer 35. Seams 25 indicate the location of the intersection of the individual growth fronts emanating from associated stems 21.

Figure 5A:
FIGS. 5A-5R are cross-sectional views showing a sequence of processing operations for forming a vertically integrated semiconductor device according to an embodiment of the disclosure.
Figure 5B:
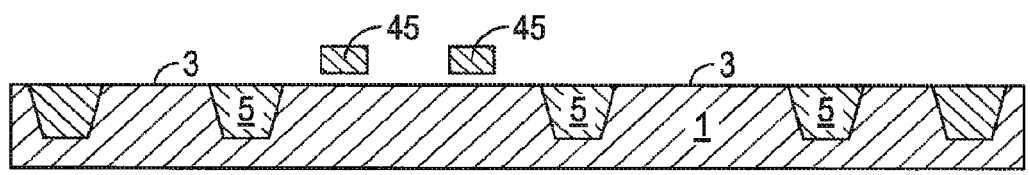
Figure 5C:
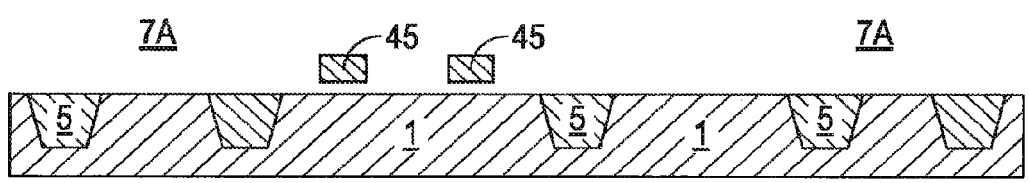
Figure 5D:
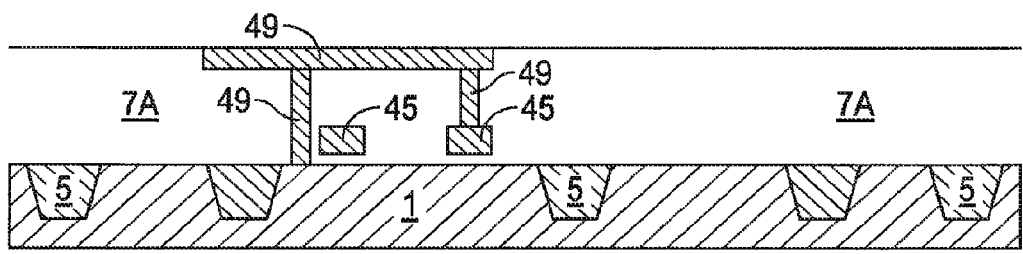
Figure 5E:
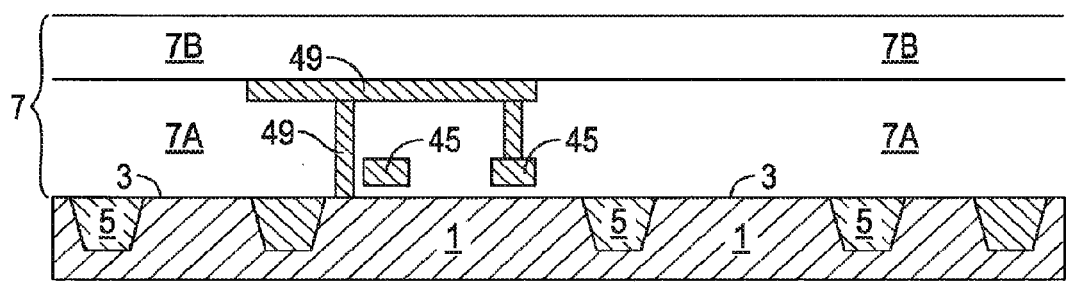
Figure 5F:
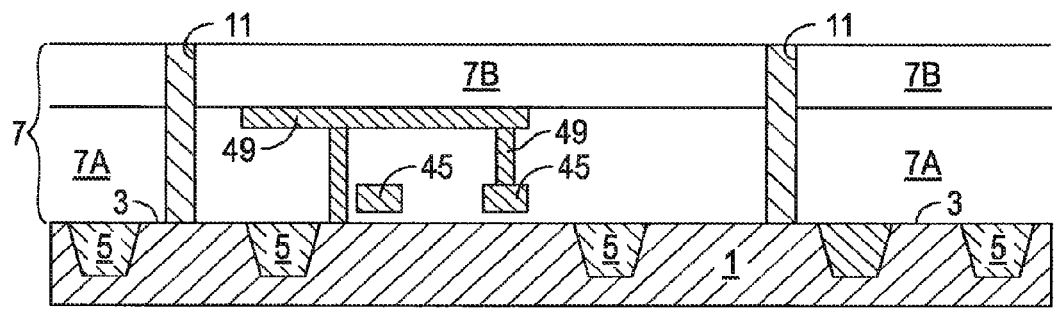
Figure 5G:
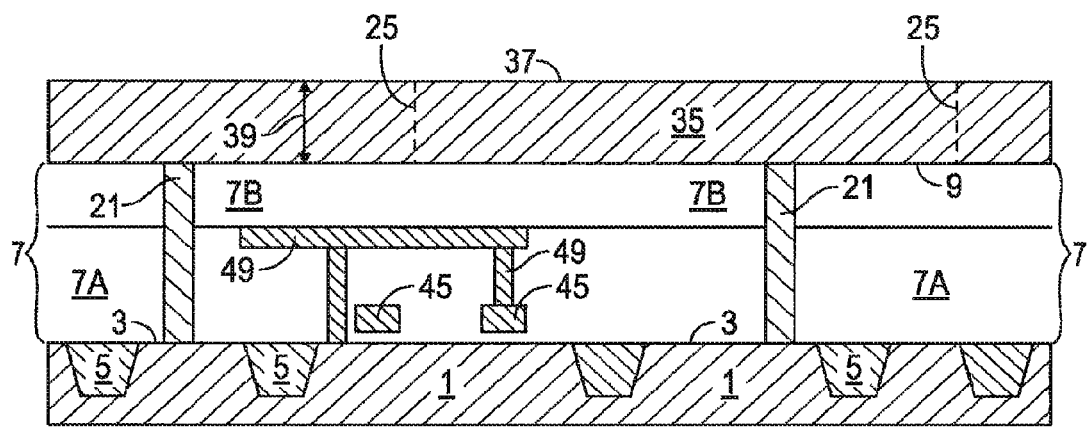
Figure 5H:
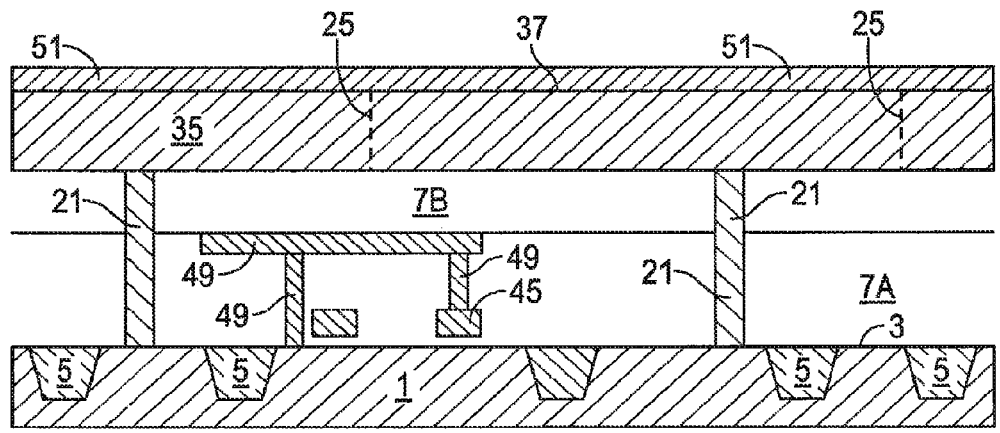
Figure 5I:
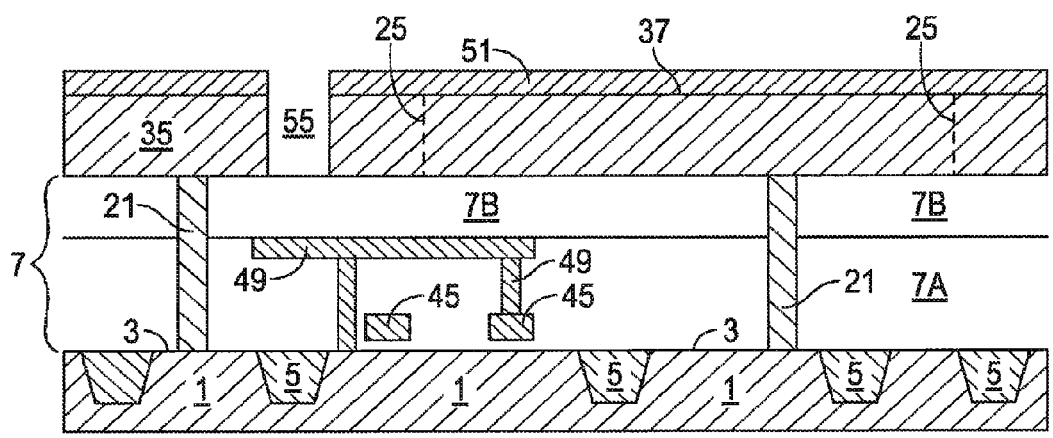
Figure 5J:
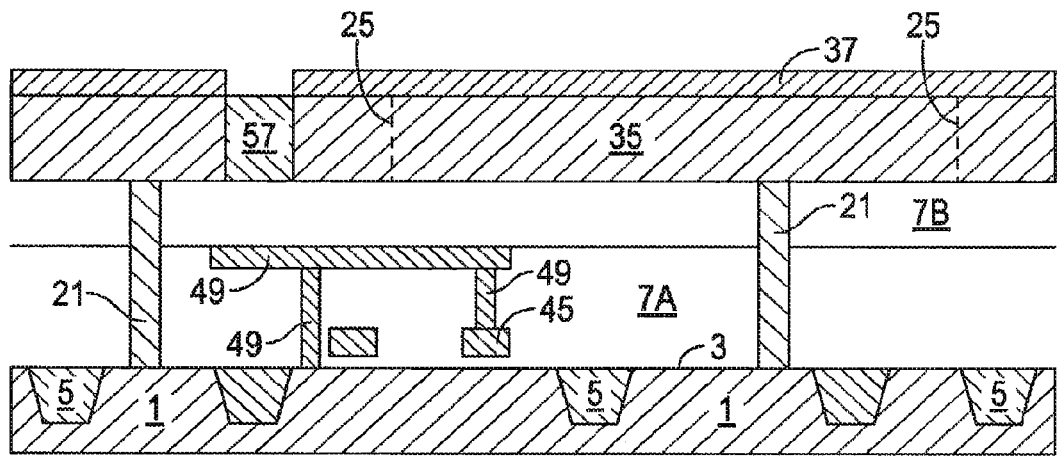
Figure 5K:
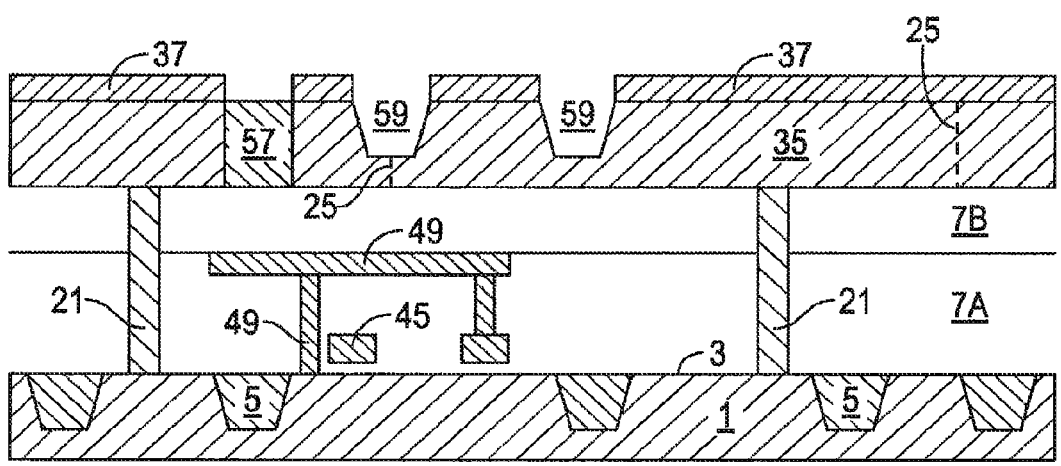
Figure 5L:
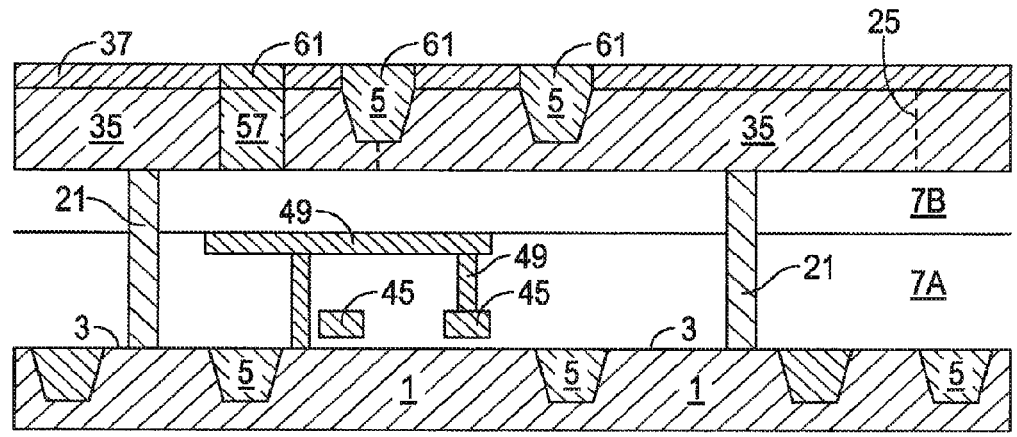
Figure 5M:
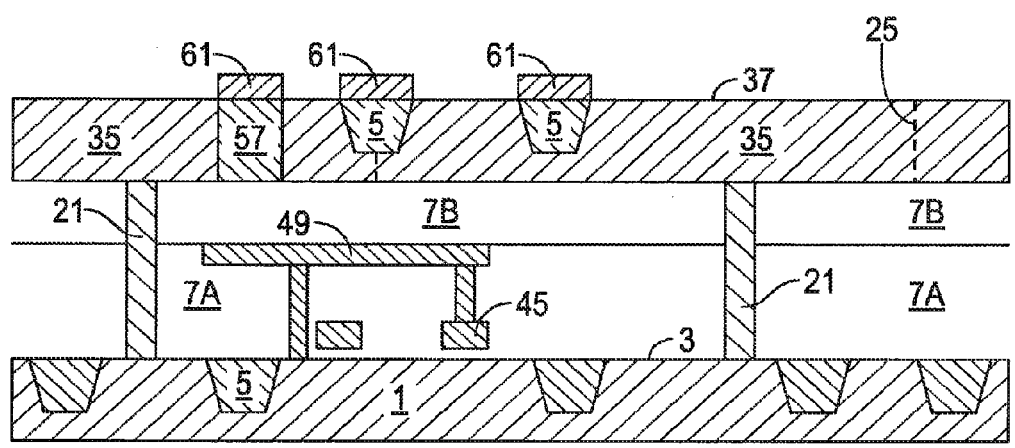
Figure 5N:
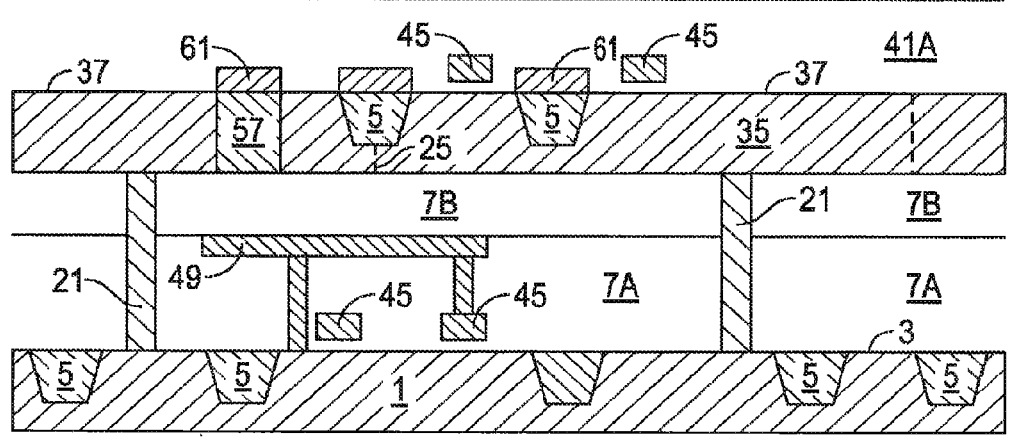
Figure 5O:
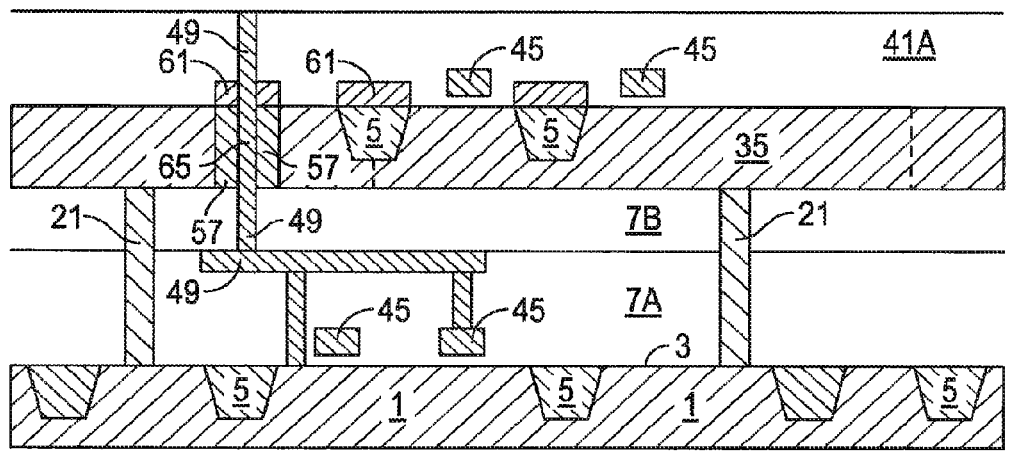
Figure 5P:
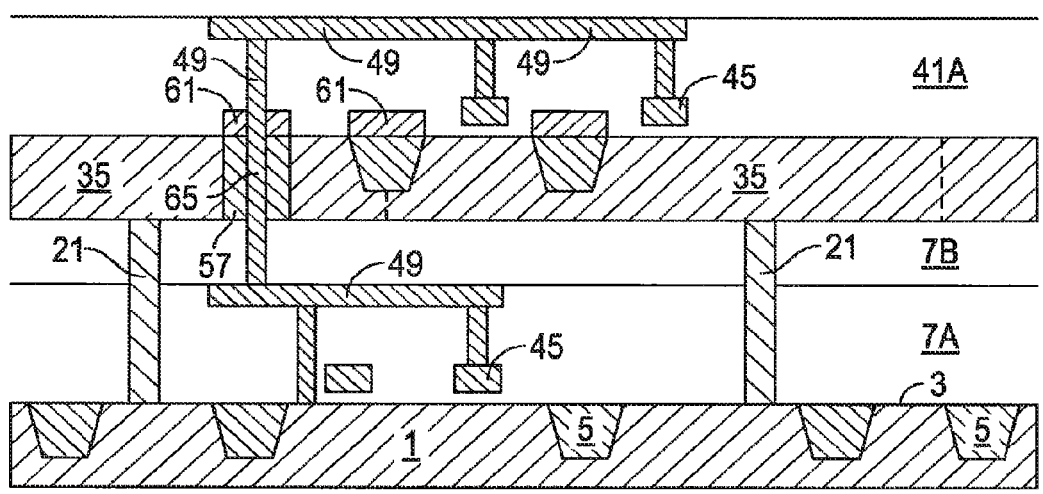
Figure 5Q:
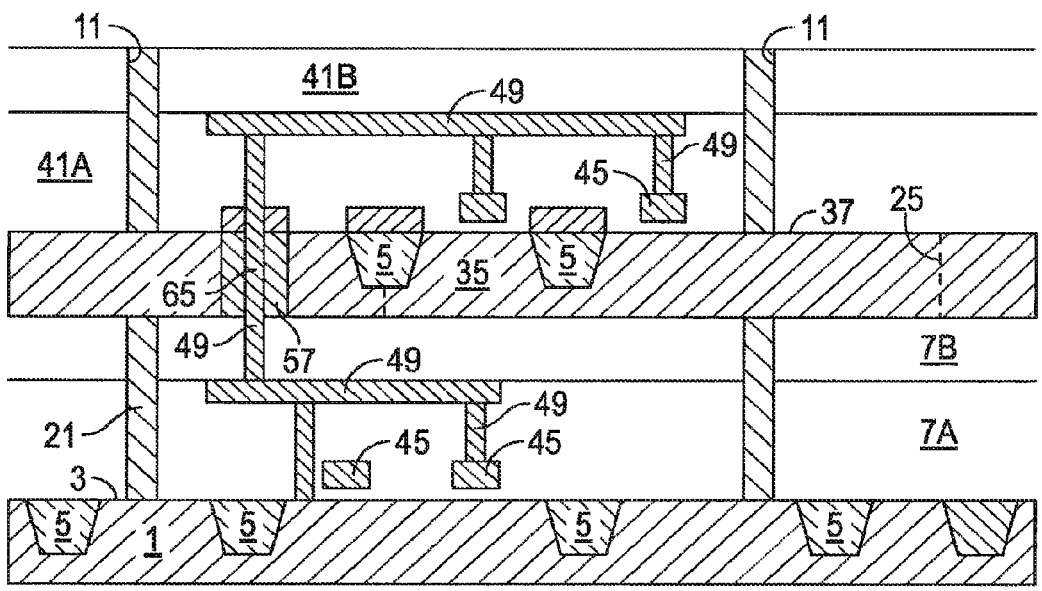
Figure 5R:
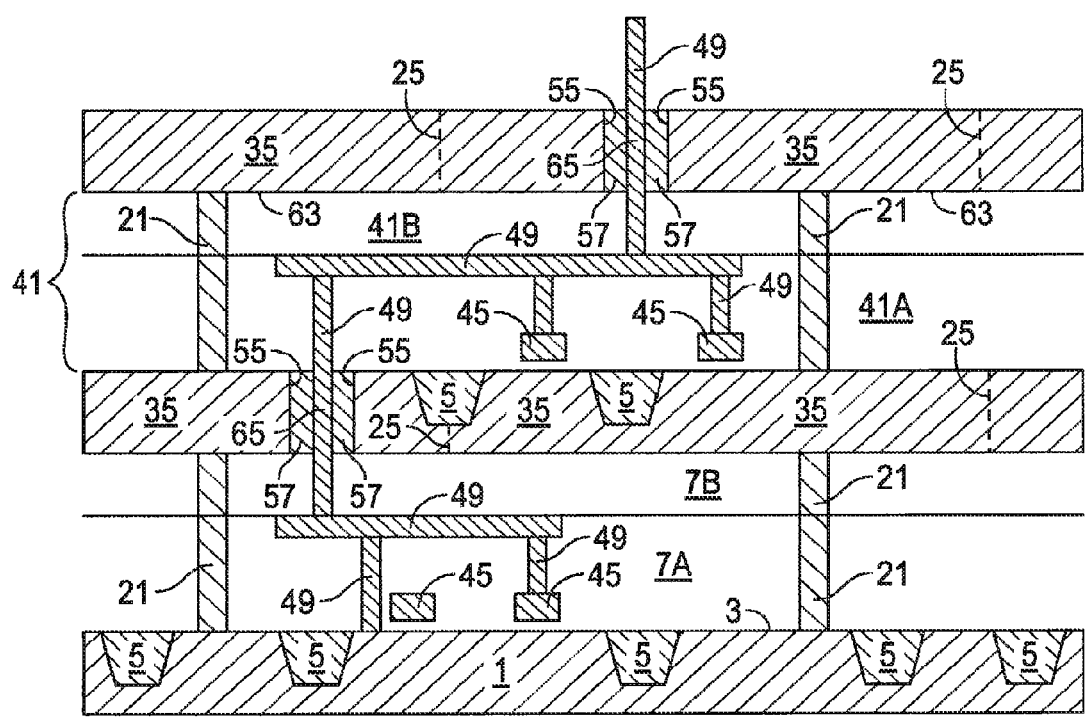

FIGS. 5A-5R represent a sequence of processing operations that may be used to form an exemplary vertically integrated semiconductor device according to the disclosure. FIG. 5A shows substrate 1, with upper surface 3 and STI structures 5 as previously described. FIG. 5B shows two exemplary semiconductor devices, i.e. transistor gates 45 formed over upper surface 3. Gates 45 shown formed over substrate 1 are intended to be exemplary only and are representative of the various semiconductor devices that may be formed. FIG. 5C shows dielectric layer 7A formed over the structure of FIG. 5B. Dielectric layer 7A may represent a portion of first dielectric 7 illustrated in FIGS. 1-3. FIG. 5D shows interconnects formed within dielectric layer 7A. Interconnects 49 may advantageously be formed of tungsten or doped polysilicon or other suitable materials. Interconnects 49 may advantageously be formed of non-metallic materials that are capable of serving as conductors. Interconnects 49 and the contact, via trench openings in which they are formed, may be formed using conventional or other methods, such as etching methods followed by deposition methods followed by damascene processing techniques.

FIG. 5E shows dielectric layer 7B formed over dielectric layer 7A and interconnect 49. Dielectric layers 7A and 7B combine to form first dielectric 7 shown and discussed supra. FIG. 5F shows openings 11 that extend through first dielectric 7 to expose portions of upper surface 3, the exposed portions of which act as seed locations. FIG. 5G shows stems 21 and continuous single crystal silicon layer 35 formed over top surface 9 of first dielectric 7 after an epitaxial growth process has taken place and after the layer has been planarized such as by polishing. Continuous single crystal silicon layer 35 includes seams 25, height 39 and is as described supra.

FIG. 5H shows pad nitride layer 51 formed over top surface 37 of continuous single crystal silicon layer 35. Pad nitride layer 51 may be formed to various suitable thicknesses and may represent a single silicon nitride layer, a single silicon oxynitride layer or either or both of the aforementioned layers formed over a pad oxide formed directly on top surface 37. Pad nitride layer 51 is patterned using conventional patterning techniques and, once patterned, is used as a mask for an etching operation used to produce holes 55 within and extending through continuous single crystal silicon layer 35 shown in FIG. 5I.

A thermal oxidation process is carried out to produce oxide plug 57 shown in FIG. 5J. Oxide plug 57 may advantageously fill the opening (55) formed in continuous single crystal silicon layer. Conventional or other methods may be used to form oxide plug 57. Furnace operations that use lower temperatures are desirable. Thermal oxidation processes such as wet thermal oxidation that utilizes lower processing temperatures, may be used. Typical wet thermal oxidation processes may be carried out using temperatures below 800 degree Celsius. In other exemplary embodiments, other thermal oxidation methods for filling in large areas with thick oxide, may be used. According to one exemplary embodiment, pillars of Si may be created in holes 55 by incomplete etching, then oxidized such that the sidewalls and the pillars are oxidized such that the pillars are consumed to form a continuous oxide plug. According to another exemplary embodiment, oxide plug 57 may be produced by filling holes 55 with dielectric using CVD deposition or spin on glass which has a lower thermal budget, then planarized as necessary. Pad nitride layer 37 is patterned and used further as a masking layer to form openings 59 within continuous single crystal silicon layer 35. Openings 59 will be used to form STI structures within continuous single crystal silicon layer 35. According to one exemplary embodiment, STI structures may be formed along seam 25, as seams 25 are locations at which active semiconductor devices are not formed. FIG. 5L shows STI structures 5 after a conventional oxide fill and polishing process sequence is used to fill former openings 59 and also produces oxide cap sections 61 above STI structures 5 and oxide plug 57.

FIG. 5M shows the structure of FIG. 5L after pad nitride layer 37 has been removed. Various known selective methods can be used. FIG. 5N shows the structure of FIG. 5M after gates 45 have been formed over top surface 37 of continuous single crystal silicon layer 35. Gates 45 shown formed over substrate 1 and over continuous single crystal silicon layer 35 are representative of various semiconductor devices and are not intended to be limiting. According to other exemplary embodiments, various other active semiconductor devices may be formed in or on substrate 1 and continuous single crystal silicon layer 35. Dielectric layer 41A is part of second dielectric 41 shown in FIG. 3 and may be formed of various suitable dielectric materials such as low-k dielectric materials, high-k dielectric materials, oxides, oxynitrides or various other suitable dielectrics including IMD (inter metal dielectrics).

FIG. 5O shows an interconnect technique for connecting devices on one continuous single crystal silicon layer 35 to devices on another continuous single crystal silicon layer 35 or to devices formed on substrate 1. An opening is formed to extend through dielectric layer 41A, oxide cap 61, oxide plug 57 and dielectric layer 7B and may include an aspect ratio as high as 15:1 or 20:1. This opening may be formed using conventional methods. The opening is then plugged using tungsten or other suitable materials to form another interconnect 49 that includes through silicon interconnect, TSI, section 65. The high aspect ratio openings can be filled with tungsten using CVD methods followed by chemical mechanical polishing, CMP. U.S. Patent publication 2010/0267230 A1 provides methods for filling tungsten contacts in high aspect ratio openings and is incorporated herein by reference as if set forth in its entirety. It can be seen that TSI section 65 is insulated from continuous single crystal silicon layer 35 by oxide plug 57 which surrounds TSI section 65 and lines the inside surfaces of the opening formed in continuous single crystal silicon layer 35.

FIG. 5P shows various other interconnects 49 formed within dielectric 41A and these interconnects 49 may be formed using conventional etching, deposition and damascene processing methods. FIG. 5Q shows dielectric layer 41B formed over the structure of FIG. 5P and also shows openings 11 formed through dielectric layers 41A and 41B and exposing a portion of top surface 37 of continuous single crystal silicon layer 35.

Suitable epitaxial growth conditions are used to cause selective CVD growth beginning at exposed portions of top surface 37 within openings 11 which act as seed locations, using conditions described supra. Growth begins in openings 11 and forms stems within dielectric layers 41A and 41B as shown in FIG. 5R. Growth continues over top surface 63 of dielectric layer 41B to produce another continuous single crystal silicon layer 35 with seams 25 after polishing. The structure is further processed as described supra to provide oxide plug 57 through which another, upper, interconnect 49 is formed including TSI section 65 that extends vertically through upper continuous single crystal silicon layer 35 shown in FIG. 5R.

The sequence of processing operations illustrated may be continued to form additional continuous single crystal silicon layers 35 over the structures shown in FIG. 5R to produce a vertically integrated semiconductor device with active devices at multiple vertical levels and interconnected to one another.

It should be understood that the various semiconductor devices such as transistors formed using gates 45 may be formed using conventional methods. The devices may be formed to include conventional source/drain portions and they may be formed in N+ or P+ active regions formed on the respective surface such as top surface 37 of continuous single crystal silicon layer 35 and upper surface 3 of substrate 1.

According to one advantageous design aspect, the sequence of processing operations may be such that the dopant introduction and annealing operations carried out later in the processing sequence require and utilize a lower thermal budget than the initially processed devices. In this manner, initially formed structures will remain thermally stable because once they are formed, lower thermal budgets are used in subsequent operations that will not cause further diffusion or undesired activation of already formed dopant impurity regions. According to another advantageous processing sequence, one thermal processing operation may be used to activate or drive in dopant impurities that have been previously introduced at multiple levels, e.g. on multiple continuous single crystal silicon layers 35. For example, a source/drain or another anneal operation that anneals dopant structures at a plurality of device levels may be used. Various device modeling techniques may be advantageously used to prescribe and optimize dopant junction depth and concentration at the lower, earlier-produced device levels in order to achieve suitable device performance at all layers of semiconductor substrate.

In one aspect, the disclosure provides a method for forming a semiconductor device having multiple layers of single crystal silicon. The method comprises providing a single crystal silicon substrate with an upper surface and forming a dielectric layer over the upper surface, the dielectric layer having openings therethrough that extend to the upper surface. The method further comprises epitaxially growing a continuous single crystal silicon layer over the dielectric layer using the openings as seed windows; forming semiconductor devices in or on the continuous single crystal silicon layer; and forming a further dielectric layer over the continuous single crystal silicon layer, the further dielectric layer having further openings therethrough that extend to the continuous single crystal silicon layer. The method further comprises epitaxially growing a further continuous single crystal silicon layer over the further dielectric layer using at least the further openings as further seed windows and forming further semiconductor devices on or in the further continuous single crystal silicon layer.

According to another aspect, provided is a vertically integrated semiconductor device comprising a plurality of vertically spaced continuous single crystal silicon layers disposed over a substrate, each of the continuous single crystal silicon layers spaced from an adjacent one of the continuous single crystal silicon layers by an interposed dielectric layer and each of the continuous single crystal silicon layers coupled to an adjacent one of the continuous single crystal silicon layers by stems extending through the associated interposed dielectric layer. Each of the continuous single crystal silicon layer include semiconductor devices formed thereon.

According to another aspect, a vertically integrated semiconductor device is provided. The vertically integrated semiconductor device comprises a plurality of vertically spaced continuous single crystal silicon layers disposed over a substrate, each of the continuous single crystal silicon layers spaced from an adjacent one of the continuous single crystal silicon layers by at least an interposed dielectric layer and each of the continuous single crystal silicon layers coupled to an adjacent one of the continuous single crystal silicon layers by stems extending through the associated interposed dielectric layer, each continuous single crystal silicon layer including semiconductor devices formed thereon.

In some embodiments, the substrate comprises single crystal silicon and a lowermost continuous single crystal silicon layer of the continuous single crystal silicon layers is coupled to the substrate by further stems extending through a subjacent dielectric layer disposed between the substrate and the lowermost continuous single crystal silicon layer.

In some embodiments, the semiconductor devices comprise transistors separated by STI (shallow trench isolation) structures formed in the associated continuous single crystal silicon layer.

In some embodiments, each continuous single crystal silicon layer includes seams at growth front locations between the stems and the semiconductor devices are disposed at locations other than at the seams.

In some embodiments, the STI structures are formed at growth front seams formed in the associated continuous single crystal silicon layer.

In some embodiments, the vertically integrated semiconductor device further comprises interconnect structures coupling at least one of the semiconductor devices on one of the continuous single crystal silicon layers to at least a further of the semiconductor devices formed on another of the continuous single crystal silicon layers, the interconnection structures comprising tungsten.

In some embodiments, the interconnect structures extend through dielectric lined interconnect openings that extend through at least one continuous single crystal silicon layer.

In some embodiments, a lower continuous single crystal silicon layer of the continuous single crystal silicon layers, includes seams at growth front locations between the stems and wherein an upper continuous single crystal silicon layer of the continuous single crystal silicon layers includes further stems that couple the upper continuous single crystal silicon layer to the lower continuous single crystal silicon layer, the further stems disposed at locations other than at the seams.

In some embodiments, at least one of the continuous single crystal silicon layers includes a thickness of about 2-3 microns and at least one of the substrate and one continuous single crystal silicon layer is doped with a dopant impurity.

In some embodiments, the vertically integrated semiconductor device further comprises interconnect structures extending through dielectric-lined openings formed within at least one continuous single crystal silicon layer.

In some embodiments, the interconnect structures are formed of tungsten.

In some embodiments, the interconnect structures are formed of heavily-doped polysilicon.

In some embodiments, each continuous single crystal silicon layer includes seams at growth front locations between the stems and further comprising STI (shallow trench isolation) structures disposed at the seams.

In some embodiments, the STI structures do not extend completely through the associated continuous single crystal silicon layer.

In some embodiments, at least one of the continuous single crystal silicon layers includes a thickness of about 2-3 microns, each continuous single crystal silicon layer includes seams at growth front locations between the stems, the semiconductor devices are disposed at locations other than at the seams, and further comprising STI (shallow trench isolation) structures formed at the seams.

According to another aspect, provided is a vertically integrated semiconductor device comprising a plurality of vertically spaced continuous single crystal silicon layers disposed over a substrate, each of the continuous single crystal silicon layers spaced from an adjacent one of continuous single crystal silicon layers by at least an interposed dielectric layer and each of the continuous single crystal silicon layers coupled to an adjacent one of the continuous single crystal silicon layers by stems extending through the associated interposed dielectric layer, each continuous single crystal silicon layer including seams at growth front locations between the stems and semiconductor devices disposed thereon at locations other than at the seams, and interconnect structures coupling at least one of the semiconductor devices on one of the continuous single crystal silicon layers to at least a further of the semiconductor devices formed on another of the continuous single crystal silicon layers.

In some embodiments, the interconnect structures comprise tungsten.

In some embodiments, the interconnect structures extend through dielectric lined interconnect openings that extend through at least one continuous single crystal silicon layer.

In some embodiments, the vertically integrated semiconductor device further comprises STI (shallow trench isolation) structures disposed at the seams.

In some embodiments, the STI structures do not extend completely through the associated continuous single crystal silicon layer.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A vertically integrated semiconductor device comprising a plurality of vertically spaced continuous single crystal silicon layers disposed over a substrate, each of said continuous single crystal silicon layers spaced from an adjacent one of said continuous single crystal silicon layers by at least an interposed dielectric layer and each of said continuous single crystal silicon layers coupled to an adjacent one of said continuous single crystal silicon layers by stems extending through said associated interposed dielectric layer, each said continuous single crystal silicon layer including semiconductor devices formed thereon, and conductive interconnect structures extending through at least one said continuous single crystal silicon layer, each said conductive interconnect structure spaced from said at least one said continuous single crystal silicon layer by a dielectric liner surrounding each said conductive interconnect structure.

2. The vertically integrated semiconductor device as in claim 1, wherein said substrate comprises single crystal silicon and a lowermost continuous single crystal silicon layer of said continuous single crystal silicon layers is coupled to said substrate by further stems extending through a subjacent dielectric layer disposed between said substrate and said lowermost continuous single crystal silicon layer.

3. The vertically integrated semiconductor device as in claim 1, wherein said semiconductor devices comprise transistors separated by STI (shallow trench isolation) structures formed in said associated continuous single crystal silicon layer.

4. The vertically integrated semiconductor device as in claim 3, wherein each said continuous single crystal silicon layer includes seams at growth front locations between said stems and said semiconductor devices are disposed at locations other than at said seams.

5. The vertically integrated semiconductor device as in claim 3, wherein said STI structures are formed at growth front seams formed in said associated continuous single crystal silicon layer.

6. The vertically integrated semiconductor device as in claim 1, wherein said conductive interconnect structures couple at least one of said semiconductor devices on one of said continuous single crystal silicon layers to at least a further of said semiconductor devices formed on another of said continuous single crystal silicon layers, said conductive interconnect structures comprising tungsten.

7. The vertically integrated semiconductor device as in claim 1, wherein a lower continuous single crystal silicon layer of said continuous single crystal silicon layers, includes seams at growth front locations between said stems and wherein an upper continuous single crystal silicon layer of said continuous single crystal silicon layers includes further stems that couple said upper continuous single crystal silicon layer to said lower continuous single crystal silicon layer, said further stems disposed at locations other than at said seams.

8. The vertically integrated semiconductor device as in claim 1, wherein at least one of said continuous single crystal silicon layers includes a thickness of about 2-3 microns and at least one of said substrate and one said continuous single crystal silicon layer is doped with a dopant impurity.

9. The vertically integrated semiconductor device as in claim 1, wherein said conductive interconnect structures couple at least one of said semiconductor devices on one of said continuous single crystal silicon layers to at least a further of said semiconductor devices formed on another of said continuous single crystal silicon layers.

10. The vertically integrated semiconductor device as in claim 1, wherein said conductive interconnect structures are formed of tungsten.

11. The vertically integrated semiconductor device as in claim 9, wherein said interconnect structures are formed of heavily-doped polysilicon.

12. A vertically integrated semiconductor device comprising a plurality of vertically spaced continuous single crystal silicon layers disposed over a substrate, each of said continuous single crystal silicon layers spaced from an adjacent one of said continuous single crystal silicon layers by at least an interposed dielectric layer and each of said continuous single crystal silicon layers coupled to an adjacent one of said continuous single crystal silicon layers by stems extending through said associated interposed dielectric layer, each said continuous single crystal silicon layer including semiconductor devices formed thereon, wherein each said continuous single crystal silicon layer includes seams at growth front locations between said stems and further comprising STI (shallow trench isolation) structures disposed at said seams.

13. The vertically integrated semiconductor device as in claim 12, wherein said STI structures do not extend completely through said associated continuous single crystal silicon layer.

14. The vertically integrated semiconductor device as in claim 1, wherein at least one of said continuous single crystal silicon layers includes a thickness of about 2-3 microns, each said continuous single crystal silicon layer includes seams at growth front locations between said stems, said semiconductor devices are disposed at locations other than at said seams, and further comprising STI (shallow trench isolation) structures formed at said seams.

15. A vertically integrated semiconductor device comprising a plurality of vertically spaced continuous single crystal silicon layers disposed over a substrate, each of said continuous single crystal silicon layers spaced from an adjacent one of said continuous single crystal silicon layers by at least an interposed dielectric layer and each of said continuous single crystal silicon layers coupled to an adjacent one of said continuous single crystal silicon layers by stems extending through said associated interposed dielectric layer, each said continuous single crystal silicon layer including seams at growth front locations between said stems and semiconductor devices disposed thereon at locations other than at said seams, and interconnect structures coupling at least one of said semiconductor devices on one of said continuous single crystal silicon layers to at least a further of said semiconductor devices formed on another of said continuous single crystal silicon layers.

16. The vertically integrated semiconductor device as in claim 15, wherein said interconnect structures comprise tungsten.

17. The vertically integrated semiconductor device as in claim 15, wherein said interconnect structures extend through dielectric lined interconnect openings that extend through at least one said continuous single crystal silicon layer.

18. The vertically integrated semiconductor device as in claim 15, further comprising STI (shallow trench isolation) structures disposed at said seams.

19. The vertically integrated semiconductor device as in claim 18, wherein said STI structures do not extend completely through said associated continuous single crystal silicon layer.

* * * * *